United States Patent
Inuiya

(10) Patent No.: US 8,541,730 B2
(45) Date of Patent: Sep. 24, 2013

(54) SOLID-STATE IMAGING DEVICE, IMAGING APPARATUS, AND METHOD FOR MANUFACTURING SOLID-STATE IMAGING DEVICE

(75) Inventor: Masafumi Inuiya, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 1203 days.

(21) Appl. No.: 12/247,865

(22) Filed: Oct. 8, 2008

(65) Prior Publication Data

US 2009/0091806 A1    Apr. 9, 2009

(30) Foreign Application Priority Data

Oct. 9, 2007   (JP) ................ P2007-263205

(51) Int. Cl.
*H01L 27/00*   (2006.01)
*H01J 40/14*   (2006.01)

(52) U.S. Cl.
USPC .................. 250/208.1; 250/214 R

(58) Field of Classification Search
USPC .......... 250/208.1, 214 R, 214.1, 370.01, 250/370.08, 370.09, 370.11, 371, 368, 369; 378/62, 87, 91, 210; 358/512–514, 401, 358/482, 483; 257/225, 226, 231–234, 252, 257/291–294, 431–437; 348/294, 297, 298, 348/302–305, 311–324
See application file for complete search history.

(56) References Cited

U.S. PATENT DOCUMENTS

| | | | |
|---|---|---|---|
| 6,627,896 B1 | 9/2003 | Hashimoto et al. | |
| 7,196,391 B2 * | 3/2007 | Hsieh ........................... | 257/444 |
| 7,236,265 B2 | 6/2007 | Hiromatsu et al. | |
| 2004/0095495 A1 | 5/2004 | Inokuma et al. | |
| 2005/0056903 A1 * | 3/2005 | Yamamoto et al. ........... | 257/433 |
| 2005/0230775 A1 * | 10/2005 | Watanabe et al. ............. | 257/444 |
| 2007/0075253 A1 | 4/2007 | Misawa et al. | |

FOREIGN PATENT DOCUMENTS

| | | |
|---|---|---|
| JP | 60-93893 A | 5/1985 |
| JP | 3-270177 A | 12/1991 |
| JP | 5-13748 A | 1/1993 |
| JP | 2000-278605 A | 10/2000 |
| JP | 2001-42042 A | 2/2001 |
| JP | 2003-163796 A | 6/2003 |
| JP | 2003-198813 A | 7/2003 |
| JP | 2004-146816 A | 5/2004 |
| JP | 2006-108525 A | 4/2006 |
| JP | 2007-101256 A | 4/2007 |

OTHER PUBLICATIONS

Japanese Office Action issued on Jul. 24, 2012 in corresponding Japanese patent application No. 2007-263205 (English translation is attached).

* cited by examiner

*Primary Examiner* — Pascal M Bui Pho
(74) *Attorney, Agent, or Firm* — Birch, Stewart, Kolasch & Birch, LLP

(57) ABSTRACT

A solid-state imaging device is provided and includes: a substrate; a plurality of photoelectric conversion elements arranged in a one-dimensional or two-dimensional array above the substrate, the plurality of photoelectric conversion elements being divided into a plurality of photoelectric conversion element groups; a plurality of semiconductor substrates between the substrate and the plurality of photoelectric conversion elements, each of the plurality of semiconductor substrates corresponding to each of the plurality of photoelectric conversion element groups; and a signal output section in the plurality of semiconductor substrates. The signal output section outputs a signal corresponding to an electric charge generated in each photoelectric conversion elements of a photoelectric conversion element group corresponding to a semiconductor substrate.

13 Claims, 7 Drawing Sheets

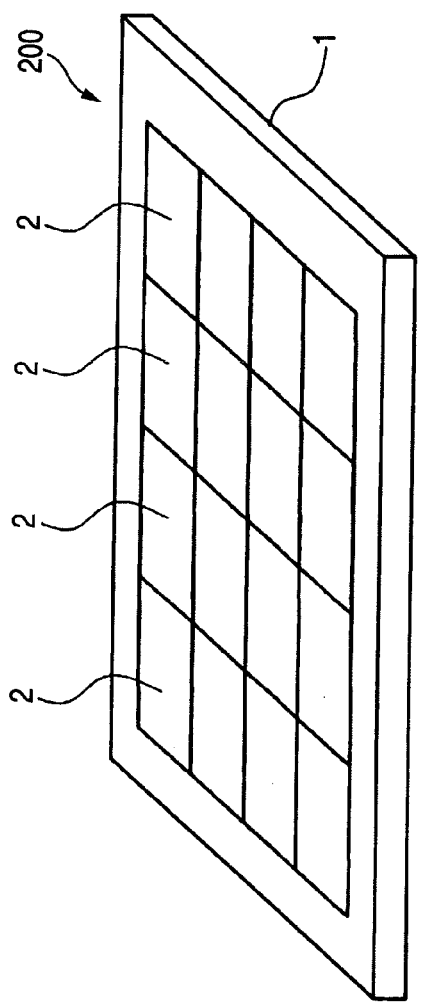

SOLID-STATE IMAGING DEVICE, IMAGING APPARATUS, AND METHOD FOR MANUFACTURING SOLID-STATE IMAGING DEVICE

This application is based on and claims priority under 35 U.S.C. §119 from Japanese Patent Application No. 2007-263205 filed Oct. 9, 2007, the entire disclosure of which is herein incorporated by reference.

BACKGROUND OF THE INVENTION

1. Field of the Invention

The present invention relates to a solid-state imaging device having a plurality of photoelectric conversion elements arranged in a one-dimensional or two-dimensional array above a substrate.

2. Description of Related Art

A one-dimensional image sensor that reads a document in a state almost in contact with the document and in a condition where a read width is set equal to an original document width, a so-called same size and contact type line sensor is widely used for a document scanner of a copying machine or a FAX. In the case of the same size and contact type line sensor, miniaturization of a scanner and reduction in cost are expected since an optical system which forms a document image on an image sensor in a reduced state is not needed.

However, in an actual semiconductor process using a silicon wafer, a plurality of image sensors are used in a connected state because an image sensor having a size larger than a wafer size (currently, maximum 300 mm in diameter) cannot be manufactured. As methods of connecting image sensors, a method of arraying a plurality of packaged image sensors in a zigzag manner in a state where pixels overlap each other and a method of connecting image sensor chips have been proposed as disclosed in The Institute of Television Engineers, Technical Report, ED681, p 49, 1982 and ED812, p 25, 1984.

In the image sensor manufactured by using a current semiconductor process, however, sensitivity variation and black level variation for every pixel occur within a wafer and between wafer lots. For this reason, when a plurality of image sensors are connected, a variation in characteristic of the sensitivity or black level in connecting portions occurs. This generates a streaky fixed pattern noise in a scanned image. Therefore, an additional signal processing circuit for suppressing the fixed pattern noise is needed.

On the other hand, it is also proposed to manufacture a large seamless image sensor at a time using an a-Si (amorphous silicon) process used for a flat panel display, which is not a semiconductor process using a silicon wafer, as disclosed in 'Electronics', 1989-7, p 51-p 56. In addition, manufacturing a large image sensor with a-Si is adopted for not only a line sensor but also a large X-ray sensor used in a medical field as disclosed in 'Applied physics', volume 73, number 7, p 931-p 934, 2004.

In the case of the a-Si, however, the mobility of electron and hole is low and a variation in electrical characteristic (particularly in Vth) in manufacturing is large compared with a silicon wafer which is crystalline silicon. Accordingly, the a-Si is not suitable for an image sensor for high sensitivity, high-speed reading, and high S/N.

Although a CCD or a CMOS sensor is excellent in terms of high sensitivity and high-speed reading since the CCD or the CMOS sensor is formed of single crystal silicon, it is not possible to manufacture a sensor having a diameter of a silicon wafer, currently, a sensor having a size of maximum 12 inches (300 mm) because a silicon wafer is manufactured as a substrate.

On the other hand, if amorphous silicon is used, a large sensor may be manufactured without a limitation in the substrate size by using a process adopted in manufacturing of a display device. In this case, however, high-speed reading cannot be expected theoretically since the mobility of electron and hole in the amorphous silicon is equal to or smaller than $\frac{1}{100}$ of that of single crystal silicon.

As a method of solving the above problems and realizing a large sensor which has high sensitivity and performs high-speed reading, a connection type sensor in which a plurality of CCDs or CMOS sensors are connected has been proposed and used (refer to JP-A-2000-278605, JP-A-2001-42042, JP-A-2003-163796, and JP-A-2003-198813).

A problem of a connection type sensor lies in a connecting method. Although the CCD or CMOS is configured to include a plurality of photodiodes arrayed and a signal readout circuit that is connected to each of the photodiodes and reads a signal charge in a sequential manner, the photodiodes and the signal readout circuit cannot be formed up to the approximate end of a chip surface (since the performance deteriorates due to an influence of the chip end surface). Accordingly, the photodiodes cannot be disposed at equal distances on the basis of a connected result.

For this reason, either a method of performing division imaging by inserting an optical system for dividing an image between an imaging lens and an image sensor or a method of arraying a plurality of imaging devices in parallel so as to overlap each other and performing mixing by signal processing is used.

Furthermore, in the CCD or the CMOS sensor, variations in characteristics for every element, particularly variations in sensitivity characteristic and black level occur. Accordingly, even if elements are arrayed with mechanically high accuracy, a sensitivity difference or a black level difference occurs in a connection portion of the elements, resulting in a fixed pattern noise. Although the fixed pattern noise can be suppressed by a signal processing circuit, the cost increases in the case.

Although the connection type sensor has the high sensitivity and performs high-speed reading as described above, there were disadvantages in that the cost for the connection increased and an imaging optical system was made large. Moreover, in the case of an area sensor, four or more sensor chips arrayed in at least two directions need to be connected at end surfaces in four directions. However, it was almost impossible to array pixels on the end surfaces in the four directions.

SUMMARY OF THE INVENTION

An object of the invention is to provide a solid-state imaging device in which a fixed pattern noise is not generated, an optical system for connection is not needed, and high sensitivity, high-speed reading, large size, and low cost can be realized.

According to an aspect of the invention, there is provided a solid-state imaging device comprising:

a substrate;

a plurality of photoelectric conversion elements arranged in a one-dimensional or two-dimensional array above the substrate, the plurality of photoelectric conversion elements being divided into a plurality of photoelectric conversion element groups;

a plurality of semiconductor substrates between the substrate and the plurality of photoelectric conversion elements, each of the plurality of semiconductor substrates corresponding to each of the plurality of photoelectric conversion element groups; and a signal output section in the plurality of semiconductor substrates, wherein the signal output section outputs a signal corresponding to an electric charge generated in each photoelectric conversion elements of a photoelectric conversion element group corresponding to a semiconductor substrate.

In the solid-state imaging device, each of the photoelectric conversion elements may include a pixel electrode, an opposite electrode opposite to the pixel electrode, and a photoelectric conversion layer between the opposite electrode and the pixel electrode; a pad portion including a conductive member may be provided on the semiconductor substrate and electrically connects to the pixel electrode of each photoelectric conversion element of the photoelectric conversion element group corresponding to the semiconductor substrate, and the signal output section may be connected to the pad portion.

In the solid-state imaging device, the opposite electrode may be disposed above the pixel electrode and has a one-sheet configuration common to the plurality of photoelectric conversion elements, and the photoelectric conversion layer may have a one-sheet configuration common to the plurality of photoelectric conversion elements In the solid-state imaging device, each of the photoelectric conversion elements may be one of a Schottky photodiode, a PIN photodiode, and a metal insulator semiconductor photodiode which are formed of amorphous silicon.

In the solid-state imaging device, the photoelectric conversion layer may include a photoelectric conversion material containing selenium as a main component.

In the solid-state imaging device, the photoelectric conversion layer may include an organic photoelectric conversion material.

The solid-state imaging device may further include a mosaic color filter above the photoelectric conversion layer.

The solid-state imaging device may further include a scintillator provided above the photoelectric conversion layer.

In the solid-state imaging device, the signal output section may include a MOS circuit that is connected to the pad portion and that converts an electric charge trapped in the pixel electrode connected to the pad portion into a signal and outputs the signal.

In the solid-state imaging device, the signal output section may include: a charge storage portion connected to the pad portion; a charge transfer device that reads and transfers electric charges accumulated in the charge storage portion; and an output portion that outputs signals corresponding to the electric charges transferred by the charge transfer device.

According to another aspect of the invention, there is provided an imaging apparatus comprising:

the solid-state imaging device described above; and a driving section for driving the solid-state imaging device, the driving section including a driving signal generating section that generates a driving signal for driving the signal output section and an encoding section that encodes the driving signal generated by the driving signal generating section, wherein the semiconductor substrate includes a decoding section that decodes the driving signal supplied from the encoding section and supplies the decoded driving signal to the signal output section provided in the semiconductor substrate.

In the imaging apparatus, the driving signal generating section may generate the driving signal the number of times required for driving the signal output section provided in one semiconductor substrate, and the encoding section may simultaneously supply a driving signal, which is obtained by encoding the driving signal, to all of the decoding section included in the solid-state imaging device.

In the imaging apparatus, the substrate may be a circuit board including the driving signal generating section and the encoding section, and a wiring line for connection between the decoding section of the solid-state imaging device and the encoding section of the circuit board may be provided to pass through the semiconductor substrate.

According to still another aspect of the invention, there is provided a method for manufacturing a solid-state imaging device including a substrate and a plurality of photoelectric conversion elements arranged in a one-dimensional or two-dimensional array above the substrate, the method comprising:

forming a signal output section in each of a plurality of semiconductor substrates, for outputting signals corresponding to electric charges generated in the photoelectric conversion elements;

forming a pad portion with a conductive material on each of the plurality of semiconductor substrate so that the pad portion is electrically connected to the signal output section;

arraying the plurality of semiconductor substrates on the substrate in a state where the pad portion is located upward; and forming the photoelectric conversion elements each including a pixel electrode, a photoelectric conversion layer, and a opposite electrode, wherein the forming of the photoelectric conversion elements includes forming the pixel electrode on the pad portion of each of the plurality of semiconductor substrates, independently for every pad portion, forming the photoelectric conversion layer having a one-sheet configuration on the pixel electrode, and forming the opposite electrode having a one-sheet configuration on the photoelectric conversion layer.

According to still another aspect of the invention, there is provided a method for manufacturing a solid-state imaging device including a substrate and a plurality of photoelectric conversion elements arranged in a one-dimensional or two-dimensional array above the substrate, the method comprising:

forming a signal output section in each of a plurality of semiconductor substrates, for outputting signals corresponding to electric charges generated in the photoelectric conversion elements;

forming a pad portion with a conductive material on each of the plurality of semiconductor substrate so that the pad portion is electrically connected to the signal output section;

arraying the plurality of semiconductor substrates on the substrate in a state where the pad portion is located upward;

forming the plurality of photoelectric conversion elements each including a pixel electrode formed at a position corresponding to the pad portion of each of the plurality of semiconductor substrates, a photoelectric conversion layer that has a one-sheet configuration and is formed on the pixel electrode, and a opposite electrode that has a one-sheet configuration and is formed on the photoelectric conversion layer; and bonding the pad portion and the pixel electrode corresponding to the pad portion together.

BRIEF DESCRIPTION OF THE DRAWINGS

The features of the invention will appear more fully upon consideration of the exemplary embodiments of the inventions, which are schematically set forth in the drawings, in which:

FIG. 5 is a view schematically showing the entire configuration of a solid-state imaging device according to a second exemplary embodiment of the invention;

DETAILED DESCRIPTION OF THE EXEMPLARY EMBODIMENTS

According to an aspect of the invention, it is possible to provide a solid-state imaging device in which a fixed pattern noise is not generated, an optical system for connection is not needed, and high sensitivity, high-speed reading, large size, and low cost can be realized.

Hereinafter, exemplary embodiments of the invention will be described with reference to the accompanying drawings.

First Embodiment

Figure 1:
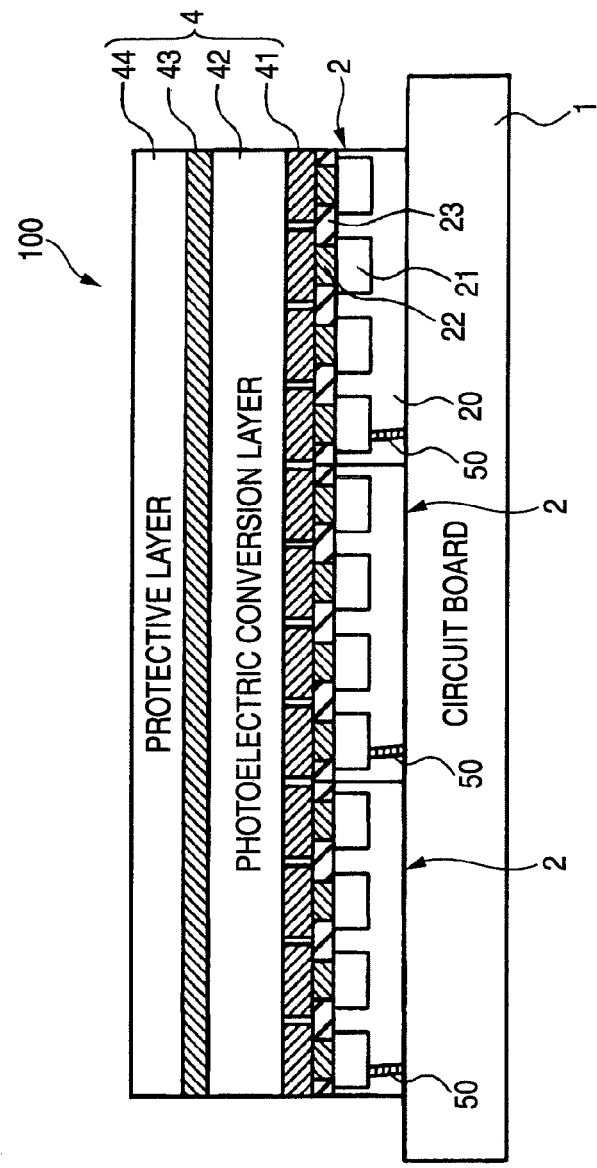
FIG. 1 is a cross-sectional view showing a schematic configuration of a solid-state imaging device according to a first exemplary embodiment of the invention.
Figure 2:
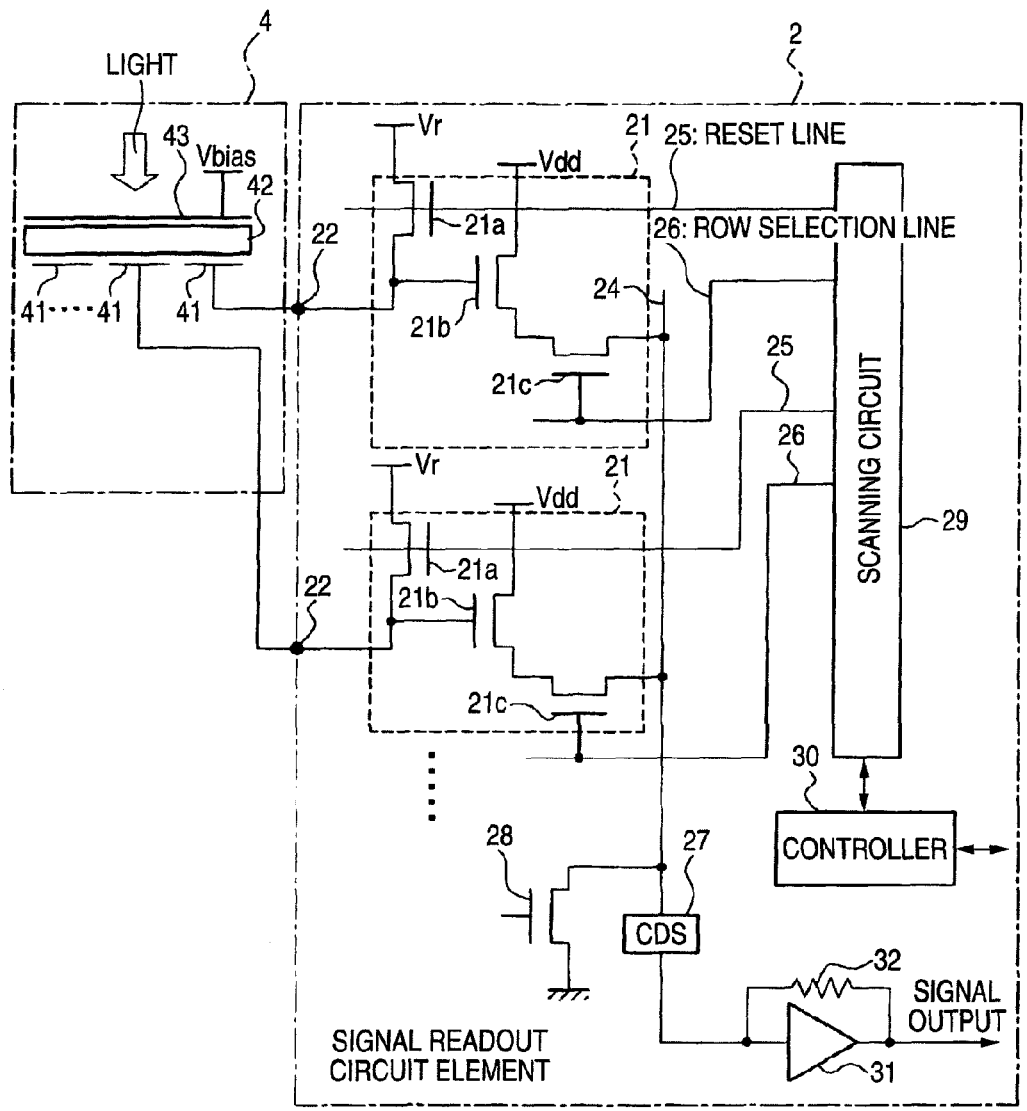
FIG. 2 is a circuit diagram showing the detailed configuration of a signal readout circuit element shown in FIG. 1.
Figure 3:
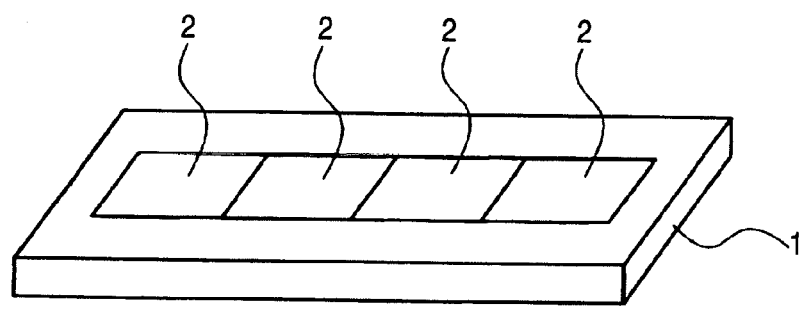
FIG. 3 is a view schematically showing the entire configuration of the solid-state imaging device shown in FIG. 1.

FIG. 1 is a cross-sectional view showing the schematic configuration of a solid-state imaging device according to a first exemplary embodiment of the invention. FIG. 2 is a circuit diagram showing the detailed configuration of a signal readout circuit element 2 shown in FIG. 1. FIG. 3 is a mimetic diagram showing the entire configuration of the solid-state imaging device shown in FIG. 1.

The solid-state imaging device 100 shown in FIG. 1 includes a circuit board 1, a plurality of signal readout circuit elements 2 arranged in a one-dimensional manner on the circuit board 1 as shown in FIG. 3, and a photoelectric conversion section 4 formed on the plurality of signal readout circuit elements 2.

The photoelectric conversion section 4 includes a plurality of pixel electrodes 41 arrayed in a one-dimensional manner, a photoelectric conversion layer 42 which has a one-sheet configuration and is formed on the plurality of pixel electrodes 41, a opposite electrode 43 which has a one-sheet configuration and is formed on the photoelectric conversion layer 42, and a protective layer 44 formed on the opposite electrode 43.

The photoelectric conversion layer 42 is formed of an organic or inorganic photoelectric conversion material which absorbs light in a specific wavelength range of incident light and generates an electric charge corresponding to the light. In case of using an organic photoelectric conversion material, for example, quinacridone which absorbs light in a green wavelength range may be used. In case of using a photoelectric conversion material containing selenium as a main component for the photoelectric conversion layer 42, an X ray can be detected in the photoelectric conversion layer 42. Accordingly, an X ray sensor can be realized.

The pixel electrode 41 may be formed of a material as long as the material is a conductive material. The opposite electrode 43 is formed of a material (for example, an ITO) allowing at least light in a wavelength range, which is absorbed in the photoelectric conversion layer 42, of incident light to be transmitted therethrough, since the incident light needs to be incident on the photoelectric conversion layer 42. A predetermined bias voltage is applied to the opposite electrode 43. By application of the bias voltage, the bias voltage is applied between the pixel electrode 41 and the opposite electrode 43 and, for example, an electron of electric charges (electron, hole) generated in the photoelectric conversion layer 42 moves to the pixel electrode 41 and is trapped therein.

The pixel electrode 41, a portion of the opposite electrode 43 overlapping the pixel electrode 41, and a portion of the photoelectric conversion layer 42 overlapping the pixel electrode 41 form one photoelectric conversion element. The solid-state imaging device shown in FIG. 1 has a plurality of photoelectric conversion elements. The plurality of photoelectric conversion elements are divided into a plurality of photoelectric conversion element groups, and the signal readout circuit element 2 is provided corresponding to each of the plurality of photoelectric conversion element groups.

Moreover, as the configuration of a photoelectric conversion element having a pair of electrodes and a photoelectric conversion layer interposed between the electrodes, a Schottky, PIN, or MIS (metal insulator semiconductor) photodiode structure using amorphous silicon is adopted.

The protective layer 44 is a layer for protecting a plurality of photoelectric conversion elements and is formed of an insulating material allowing incident light to be transmitted therethrough.

As shown in FIGS. 1 and 2, the signal readout circuit element 2 includes a signal output section having a semiconductor substrate 20 formed of crystalline silicon or polysilicon, a pad portion 22, an insulating layer 23, a scanning circuit 29, a controller 30, a MOS circuit 21, a CDS 27, a transistor 28, an A/D converter 31, a resistor 32, a signal line 24, a reset line 25, and a row selection line 26.

The MOS circuit 21 and the pad portion 22 are provided corresponding to the pixel electrode 41 of each photoelectric conversion element included in the photoelectric conversion element group corresponding to the signal readout circuit element 2.

The pad portion 22 electrically connects the corresponding pixel electrode 41 and an input terminal of the MOS circuit 21 corresponding to this pixel electrode 41 with each other and is formed of a conductive material.

As shown in FIG. 2, the MOS circuit 21 has a known three-transistor configuration including a reset transistor 21a for resetting an electric charge trapped in the pixel electrode 41, an output transistor 21b which converts the electric charge into a signal corresponding to the amount of electric charges, and a row selection transistor 21c which selectively outputs an output signal from the output transistor 21b to the signal line 24.

The scanning circuit 29 is connected to a gate of the reset transistor 21a through the reset line 25. The scanning circuit 29 is connected to a gate of the row selection transistor 21c through the row selection line 26. The signal line 24 is connected to an output terminal of the row selection transistor 21c. When a row selection signal is supplied from the scanning circuit 29 to the MOS circuit 21 through the row selection line 26, a signal corresponding to the electric charge trapped in the corresponding pixel electrode 41 is output from the row selection transistor 21c to the signal line 24. After output of the signal, when a reset signal is supplied through the reset line 25, the electric charge trapped in the pixel electrode 41 is reset by the reset transistor 21a. The scanning circuit 29 outputs all signals from the MOS circuit 21 by sequentially supplying a row selection signal to each MOS circuit 21.

The controller 30 controls the scanning circuit 29 and is controlled by a system controller which makes an overall control of an imaging apparatus in which the solid-state imaging device 100 is provided.

The CDS 27 is a circuit which performs noise elimination by performing correlation double sampling processing on the signal output to the signal line 24. The A/D converter 31 converts the output signal from the CDS 27 into a digital signal.

Thus, the signal output section is formed in the semiconductor substrate 20 and on the semiconductor substrate 20 by a known CMOS process. The pad portion 22 is formed on the semiconductor substrate 20 formed with the signal output section. The insulating layer 23 serves to insulate the pad portion 22 other than a surface thereof.

Constituent components, such as a memory in which a digital signal output from the signal readout circuit element 2 is temporarily stored, a digital signal processing circuit which generates image data by performing digital signal processing on the digital signal stored in the memory, a compression and decompression circuit which performs compression and decompression of the image data, and the system controller, are formed on the circuit board 1. Connection between an output terminal of the signal readout circuit element 2 and an input terminal of the circuit board 1 is made by using a through wiring line 50 which passes through the semiconductor substrate 20.

The pixel electrode 41 is formed on the corresponding pad portion 22, and the plane area is sufficiently larger than that of the pad portion 22. Thus, the positional deviation between the pixel electrode 41 and the pad portion 22 during a manufacturing process may be permitted. In addition, the pixel electrodes 41 are arrayed at equal distances on the plurality of signal readout circuit elements 2.

An operation of the solid-state imaging device 100 configured as above will be described.

After exposure time ends, signals generated in photoelectric conversion elements of each photoelectric conversion element group are output from the signal readout circuit elements 2 corresponding to that photoelectric conversion element group and the signals are stored in a memory of the circuit board 1. If a configuration in which parallel processing of writing of the signals into the memory can be executed is adopted, reading of the signals from the signal readout circuit element 2 can be performed simultaneously in all the signal readout circuit elements 2. In the case of a configuration in which parallel processing is not possible, reading of a signal from each signal readout circuit element 2 is performed by timing shift.

When all signals from the plurality of photoelectric conversion elements included in the solid-state imaging device 100 are stored in the memory, image data with the same resolution as the plurality of photoelectric conversion elements is generated from the signals and the image data is stored in a record medium.

A method of manufacturing the solid-state imaging device 100 configured as above will be described.

Figure 4A:
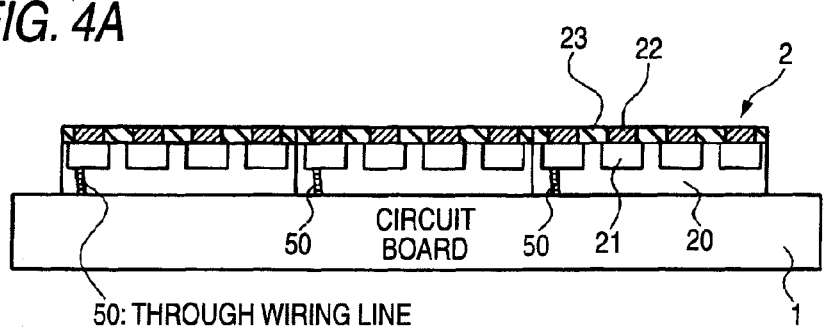
FIGS. 4A to 4C are cross-sectional views schematically showing a manufacturing process of the solid-state imaging device shown in FIG. 1.

First, required circuits, such as a digital signal processing circuit, are formed on the circuit board 1. Then, the signal output section, the scanning circuit 29, the controller 30, and the through wiring line 50 are formed in the semiconductor substrate 20 using a known CMOS process, the pad portion 22 is formed thereon, an insulating material is formed on the pad portion 22, and the insulating material is made flat until the pad portion 22 is exposed in order to form the insulating layer 23, thereby forming the signal readout circuit element 2. After forming the plurality of signal readout circuit elements 2, the plurality of signal readout circuit elements 2 are mounted on the circuit board 1 such that the pad portion 22 has a straight line shape and the height of the pad portion 22 is fixed (FIG. 4A). At this time, connection between a circuit of the circuit board 1 and the through wiring line 50 is also made. The plurality of signal readout circuit elements 2 are fixed to the circuit board 1 with an adhesive, for example, after mounting the signal readout circuit elements 2.

Then, a conductive material is formed on the pad portion 22 and the insulating layer 23 and is patterned to thereby form the pixel electrodes 41 on the pad portion 22 at equal distances. Since the plane area of the pixel electrode 41 is sufficiently larger than that of the pad portion 22, the pixel electrodes 41 can be formed at equal distances even if there is a variation in formation position of the pad portion 22. As a result, the array pitch between the photoelectric conversion elements may be fixed.

Figure 4B:
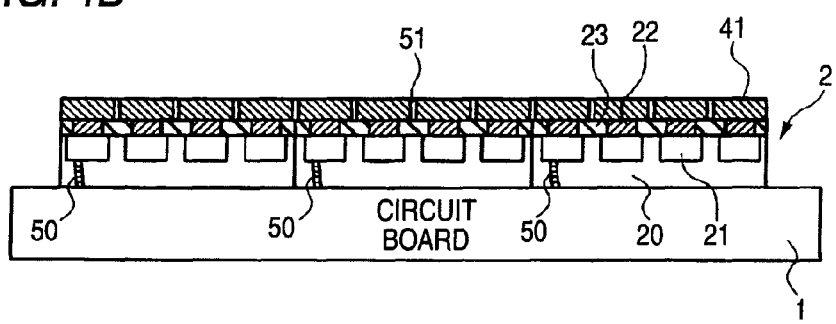

Then, an insulating layer 51 is formed in a gap between the pixel electrodes 41 by forming an insulating material on the pixel electrodes 41 and making the insulating material flat until the pixel electrodes 41 are exposed (FIG. 4B). In addition, the pixel electrodes 41 and the insulating layer 51 may also be formed by forming an insulating material on the pad portion 22 and the insulating layer 23, making the insulating material left only in a region where a gap between the pixel electrodes 41 is to be present by a photolithographic technique, forming a conductive material, and making the conductive material flat by CMP.

Then, on the pixel electrodes 41 and the insulating layer 51, a photoelectric conversion material is formed over a plurality of semiconductor substrates 20 to thereby form the photoelectric conversion layer 42 having a one-sheet configuration above the plurality of semiconductor substrates 20. Then, the opposite electrode 43 having a one-sheet configuration is formed by forming an ITO on the photoelectric conversion layer 42 and the protective layer 44 is formed by forming a transparent resin, for example, on the opposite electrode 43 (FIG. 4C), thereby obtaining the device shown in FIG. 1.

As described above, in the case of the pixel electrodes 41, the processing accuracy is far low and the accuracy of alignment with the pad portion 22 is also low, compared with the signal readout circuit elements 2. In addition, constituent elements located above the pixel electrodes 41 of the photoelectric conversion section 4 may be formed only by film forming processing of a material. Accordingly, since a process used for an amorphous silicon sensor can be adopted to form the photoelectric conversion section 4, and the large photoelectric conversion section 4 can be created. Furthermore, since a means for reading a signal from the large photoelectric conversion section 4 is realized by connecting the plurality of signal readout circuit elements 2 formed by using a silicon wafer or a polysilicon wafer, a variation in electrical characteristics in manufacturing may be reduced.

Thus, according to the solid-state imaging device 100, the large photoelectric conversion section can be formed without a joint and a signal obtained from the large photoelectric conversion section can be read by the signal readout circuit element 2 using a semiconductor substrate. As a result, it is possible to provide a line sensor which has high sensitivity and large size, performs a high-speed read operation, is manufactured at low cost, and does not need an optical system for connection and in which a fixed pattern noise resulting from connection is not generated.

Furthermore, according to the solid-state imaging device 100, connection between the signal readout circuit elements 2 and the circuit board 1 is made by the through wiring line passing through the semiconductor substrate 20. Accordingly, the wiring line for connection does not need to be formed on a surface of the semiconductor substrate 20, and the degree of freedom of the arrangement layout of constituent elements of the signal readout circuit element 2 can be improved. As a result, it becomes easy to array a plurality of photoelectric conversion elements at fixed pitches.

Furthermore, in FIG. 1, color imaging may be performed by providing a mosaic color filter (for example, one obtained by arraying in the mosaic shape three kinds of color filters of a color filter allowing red light to be transmitted therethrough, a color filter allowing green light to be transmitted therethrough, and a color filter allowing blue light to be transmitted therethrough) divided for a plurality of photoelectric conversion elements above the photoelectric conversion layer 42, for example, between the opposite electrode 43 and the protective layer 44 and forming the photoelectric conversion layer 42 using a material that absorbs light in a visible range and generates an electric charge corresponding to the light.

Furthermore, in FIG. 1, an X-ray imaging may be performed by providing a scintillator above the photoelectric conversion layer 42, for example, between the opposite electrode 43 and the protective layer 44 and forming the photoelectric conversion layer 42 using a material that absorbs an X ray and generates an electric charge corresponding to the X ray.

Furthermore, other than those described above, the signal output section of the solid-state imaging device 100 may also be formed by using a CCD circuit including a charge storage portion connected to the pad portion 22, a charge transfer device (CCD) which reads and transfers electric charges accumulated in the charge storage portion, and an output portion which outputs signals corresponding to the electric charges transferred by the charge transfer device.

Moreover, although connection between the signal readout circuit element 2 and the circuit board 1 is made by the through wiring line passing through the semiconductor substrate 20 in the above description, it is also possible to provide a pad connected to the signal output section in a region where the signal readout circuit element 2 is not present and to connect the pad and the circuit board 1 to each other with a wiring line.

Figure 4C:
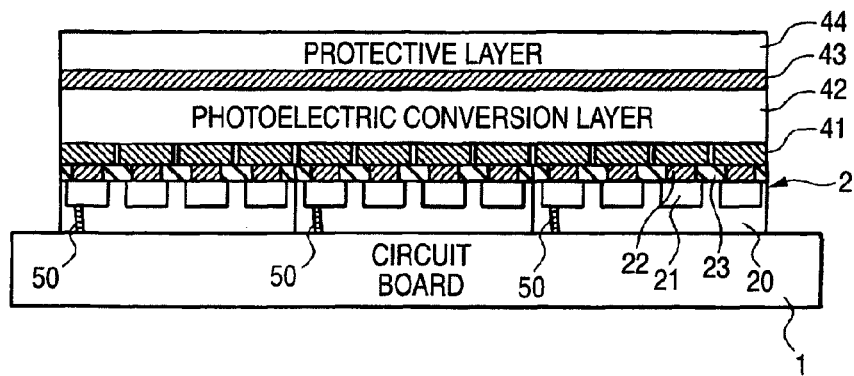

Moreover, although the pixel electrodes 41, the photoelectric conversion layer 42, the opposite electrode 43, and the protective layer 44 are laminated sequentially from the state shown in FIG. 4A in the above description, a device shown in FIG. 4C may also be formed by independently forming elements in a state shown in FIG. 4A and elements above the pixel electrodes 41 shown in FIG. 4C and bonding those elements.

Second Embodiment

In a solid-state imaging device described in a second exemplary embodiment, the array of the signal readout circuit elements 2 of the solid-state imaging device 100 described in the first embodiment is changed from the one-dimensional shape to the two-dimensional shape, the array of photoelectric conversion elements corresponding to the respective signal readout circuit element 2 is changed from the one-dimensional shape to the two-dimensional shape, and the configuration of each signal readout circuit element 2 and the configuration of the circuit board 1 change with the changes.

Figure 6:
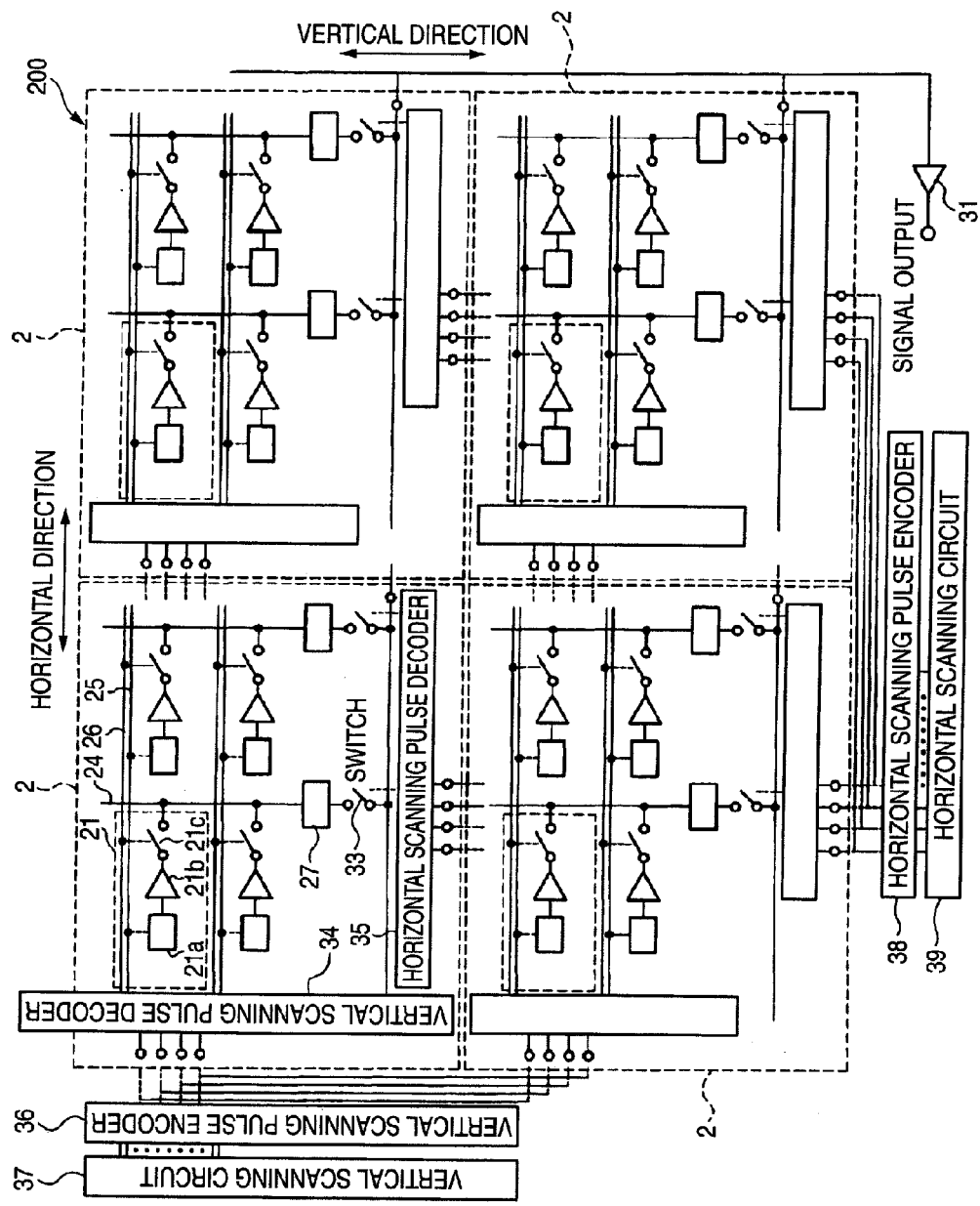
FIG. 6 is a plan view schematically showing the solid-state imaging device according to the second embodiment.
Figure 7:
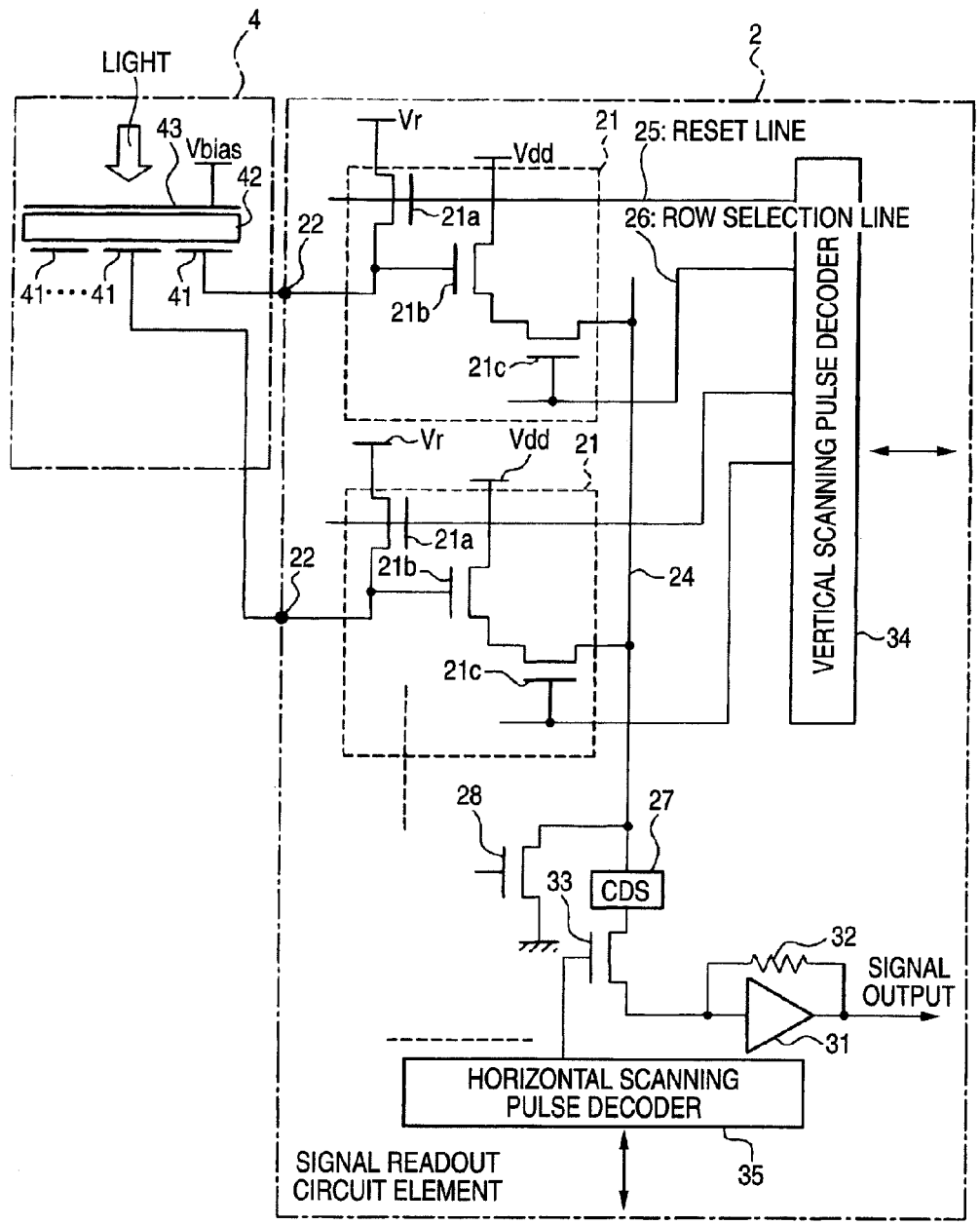
FIG. 7 is a circuit diagram showing the detailed configuration of a signal readout circuit element shown in FIG. 6.

FIG. 5 is a schematic view showing the entire configuration of a solid-state imaging device 200 according to a second embodiment of the invention. FIG. 6 is a plan view schematically showing the solid-state imaging device 200 according to the second embodiment of the invention. FIG. 7 is a circuit diagram showing the detailed configuration of a signal readout circuit element 2 shown in FIG. 6. The cross-sectional view schematically showing the solid-state imaging device 200 is the same as that shown in FIG. 1.

The solid-state imaging device 200 includes a circuit board 1, four or more signal readout circuit elements 2 (here, four signal readout circuit elements 2 are assumed) arrayed in a two-dimensional manner on the circuit board 1 as shown in FIG. 5, and a photoelectric conversion section 4 formed on the signal readout circuit elements 2. Photoelectric conversion elements formed on each of the signal readout circuit elements 2 are arrayed in the two-dimensional shape as a whole. Thus, an area sensor is formed. The number of photoelectric conversion elements formed on each signal readout circuit element 2 corresponding to the signal readout circuit element 2 is (3000 in a vertical direction×3000 in a horizontal direction), for example. That is, the solid-state imaging device 200 may obtain an image having 36 million pixels.

The signal readout circuit element 2 includes 3000 pad portions 22 corresponding to pixel electrodes 41 of respective photoelectric conversion elements of a corresponding photoelectric conversion element group and 3000 MOS circuits 21 connected to the 3000 pad portions 22.

A row selection line 26 and a reset line 25 are provided on a MOS circuit row configured to include the 3000 MOS circuits 21 provided in parallel in a horizontal direction. The row selection line 26 is connected to a gate of each row selection transistor 21c of the MOS circuit row, and the reset line 25 is connected to a gate of each reset transistor 21a of the MOS circuit row. The row selection line 26 and the reset line 25 are connected to a vertical scanning pulse decoder 34.

A signal line 24, a CDS 27, an A/D converter 31, and a column selection transistor 33 are provided on a MOS circuit column configured to include the 3000 MOS circuits 21 provided in parallel in a vertical direction. The signal line 24 is connected to an output terminal of each row selection transistor 21c of the MOS circuit column. The signal line 24 is connected to the CDS 27, the CDS 27 is connected to an input of the column selection transistor 33, and a gate of the column selection transistor 33 is connected to a horizontal scanning pulse decoder 35. The A/D converter 31 is connected to an output of the column selection transistor 33.

The MOS circuit 21, the CDS 27, the transistor 28, the A/D converter 31, the resistor 32, the signal line 24, the reset line 25, the row selection line 26, and the column selection transistor 33 form a signal output section.

As shown in FIG. 6, a vertical scanning pulse encoder 36, a vertical scanning circuit 37, a horizontal scanning pulse encoder 38, and a horizontal scanning circuit 39 are formed on the circuit board 1 in addition to a circuit that processes a signal output from each signal readout circuit element 2. The vertical scanning pulse encoder 36, the vertical scanning circuit 37, the horizontal scanning pulse encoder 38, and the horizontal scanning circuit 39 are constituent components on a side of an imaging apparatus in which the solid-state imaging device 200 is mounted and function as a driving means for driving the solid-state imaging device 200.

The vertical scanning circuit 37 generates 3000 row selection signals and 3000 reset signals to be output to respective MOS circuit rows included in one signal readout circuit element 2, and 6000 signal lines the number of which is the same as the total number of row selection lines 26 and reset lines 25 included in one signal read circuit element 2 are connected to the vertical scanning circuit 37.

The vertical scanning pulse encoder 36 encodes row selection signals and reset signals, which are received from the 6000 signal lines connected with the vertical scanning circuit 37, reduces the number of row selection signals and reset signals, and outputs the reduced row selection signals and reset signals to the vertical scanning pulse decoder 34 of each signal readout circuit element 2 simultaneously.

The vertical scanning pulse decoder 34 decodes the row selection signals and the reset signals, which are received from the vertical scanning pulse encoder 36, to restore 3000 row selection signals and 3000 reset signals and supplies the 3000 row selection signals and the 3000 reset signals to the reset lines 25 and the row selection lines 26 in a sequential manner.

The horizontal scanning circuit 39 generates 3000 row selection signals, which are to be output to column selection transistors 33 included in one signal readout circuit element 2, and 3000 signal lines the number of which is the same as the total number of column selection transistors 33 included in one signal readout circuit element 2 are connected to the horizontal scanning circuit 39.

The horizontal scanning pulse encoder 38 encodes column selection signals, which are received from the 3000 signal lines connected with the horizontal scanning circuit 39, reduces the number of column selection signals, and outputs the reduced row selection signals to the horizontal scanning pulse decoder 35 of each signal readout circuit element 2 simultaneously.

The horizontal scanning pulse decoder 35 decodes the row selection signals, which are received from the horizontal scanning pulse encoder 38, to restore 3000 row selection signals, and supplies the 3000 row selection signals to the respective column selection transistors 33.

A wiring line for connection between the vertical scanning pulse decoder 34 and the vertical scanning pulse encoder 36 and a wiring line connection between the horizontal scanning pulse decoder 35 and the horizontal scanning pulse encoder 38 are formed of a through wiring line 50 passing through the semiconductor substrate 20 as shown in FIG. 1.

The vertical scanning pulse decoder 34 selects the MOS circuit rows sequentially from the above by supplying row selection signals to the row selection lines 26 sequentially from the above. The horizontal scanning pulse decoder 35 can make a signal from each MOS circuit 21 of a MOS circuit row selected sequentially output by supplying column selection signals to the column selection transistors 33 sequentially from the left while one MOS circuit row is being selected. Through such processing, a signal generated in each photoelectric conversion element of each signal readout circuit element 2 can be output to the outside.

A method of manufacturing method the solid-state imaging device 200 configured as described above will be described.

First, required circuits including a digital signal processing circuit, the vertical scanning pulse encoder 36, the vertical scanning circuit 37, the horizontal scanning pulse encoder 38, and the horizontal scanning circuit 39 are formed on the circuit board 1. Then, the signal output section, the vertical scanning pulse decoder 34, the horizontal scanning pulse decoder 35, and the through wiring line 50 are formed in the semiconductor substrate 20 using a known CMOS process, the pad portion 22 is formed thereon, an insulating material is formed on the pad portion 22, and the insulating material is made flat until the pad portion 22 is exposed in order to form the insulating layer 23, thereby forming the signal readout circuit element 2.

After forming the four signal readout circuit elements 2, the signal readout circuit elements 2 are mounted on the circuit board 1 such that the pad portion 22 has a two-dimensional shape and the height of the pad portion 22 is fixed. At this time, connection between a circuit of the circuit board 1 and the through wiring line 50 is also made. After mounting the signal readout circuit element 2, the four signal readout circuit elements 2 are fixed to the circuit board 1 with an adhesive, for example. Thereafter, the pixel electrodes 41, the photoelectric conversion layer 42, the opposite electrode 43, and the protective layer 44 are formed by using the same method as in the first embodiment, thereby completing the solid-state imaging device 200.

As described above, according to the solid-state imaging device 200, a large image sensor can be realized by arraying the signal readout circuit elements 2 in the two-dimensional shape and forming the photoelectric conversion elements corresponding to the signal readout circuit elements 2. Moreover, the vertical scanning circuit 37 and the horizontal scanning circuit 39 are not provided but the vertical scanning pulse decoder 34 and the horizontal scanning pulse decoder 35 are provided in the signal readout circuit element 2, and the vertical scanning circuit 37, the vertical scanning pulse encoder 36, the horizontal scanning circuit 39, and the horizontal scanning pulse encoder 38 are provided in the circuit board 1. The circuit size of the vertical scanning pulse decoder 34 and the horizontal scanning pulse decoder 35 is sufficiently smaller than that of the vertical scanning circuit 37 and the horizontal scanning circuit 39. Accordingly, since the degree of freedom of the arrangement layout of the pad portion 22 or the MOS circuit 21 included in the signal readout circuit element 2 can be improved, it becomes easy to array a plurality of photoelectric conversion elements at fixed pitches.

Furthermore, the number of wiring lines for connection between the circuit board 1 and the signal readout circuit element 2 can be significantly reduced by inputting a signal from each of the vertical scanning circuit 37 and the horizontal scanning circuit 39 to an MOS circuit through the vertical scanning pulse decoder 34, the horizontal scanning pulse decoder 35, the vertical scanning pulse encoder 36, and the horizontal scanning pulse encoder 38 without directly inputting the signal to the MOS circuit. Therefore, even in the case of a large image sensor having 36 million pixels, leading of wiring lines required for manufacturing can be performed satisfactorily.

Furthermore, since signals from the vertical scanning pulse encoder 36 and the horizontal scanning pulse encoder 38 are input to the vertical scanning pulse decoder 34 and the horizontal scanning pulse decoder 35 in each signal readout circuit element 2 at the same timing, signal reading processing can be performed in parallel in all the signal readout circuit elements 2. As a result, a time taken for signal readout can be shortened.

In addition, similar to the present embodiment, the solid-state imaging device 100 may also have a configuration in which an encoder and a decoder are provided. In this case, it is preferable to adopt a configuration in which the scanning circuit 29 shown in FIG. 2 and an encoder, which encodes a signal generated in the scanning circuit 29, are provided in the circuit board 1 and a decoder, which decodes the signal from the encoder, is provided instead of the scanning circuit 29 shown in FIG. 2. Also in this case, signal reading processing from each signal readout circuit element 2 can be performed simultaneously by supplying a signal from the encoder, which is provided in the circuit board 1, to the decoder of each signal readout circuit element 2 at the same time, an imaging time can be shortened.

What is claimed is:

1. A solid-state imaging device comprising:
a substrate;
a plurality of photoelectric conversion elements arranged in a one-dimensional or two-dimensional array above the substrate, the plurality of photoelectric conversion elements being divided into a plurality of photoelectric conversion element groups;
a plurality of semiconductor substrates between the substrate and the plurality of photoelectric conversion elements, each of the plurality of semiconductor substrates corresponding to each of the plurality of photoelectric conversion element groups; and
a signal output section in the plurality of semiconductor substrates, wherein the signal output section outputs a signal corresponding to an electric charge generated in each photoelectric conversion elements of a photoelectric conversion element group corresponding to a semiconductor substrate;
wherein each of the photoelectric conversion elements includes a pixel electrode, an opposite electrode opposite to the pixel electrode, and a photoelectric conversion layer between the opposite electrode and the pixel electrode,
a pad portion including a conductive member is provided on the plurality of semiconductor substrates and electrically connects to the pixel electrode of each photoelectric conversion element of the photoelectric conversion element group corresponding to each of the plurality of semiconductor substrates, and the signal output section is connected to the pad portion; and
wherein the opposite electrode is disposed above the pixel electrode and has a one-sheet configuration common to the plurality of photoelectric conversion elements,
the photoelectric conversion layer has a one-sheet configuration common to the plurality of photoelectric conversion elements, and
the plurality of semiconductor substrates are horizontally in contact and adjacent to each other.

2. The solid-state imaging device according to claim 1, wherein each of the photoelectric conversion elements is one of a Schottky photodiode, a PIN photodiode, and a metal insulator semiconductor photodiode which are formed of amorphous silicon.

3. The solid-state imaging device according to claim 1, wherein the photoelectric conversion layer includes a photoelectric conversion material containing selenium as a main component.

4. The solid-state imaging device according to claim 1, wherein the photoelectric conversion layer includes an organic photoelectric conversion material.

5. The solid-state imaging device according to claim 4, further comprising a mosaic color filter above the photoelectric conversion layer.

6. The solid-state imaging device according to claim 4, further comprising a scintillator above the photoelectric conversion layer.

7. The solid-state imaging device according to claim 1, wherein the signal output section includes a MOS circuit that is connected to the pad portion and that converts an electric charge trapped in the pixel electrode connected to the pad portion into a signal and outputs the signal.

8. The solid-state imaging device according to claim 1, wherein the signal output section includes: a charge storage portion connected to the pad portion; a charge transfer device that reads and transfers electric charges accumulated in the charge storage portion; and an output portion that outputs signals corresponding to the electric charges transferred by the charge transfer device.

9. An imaging apparatus comprising:
a solid-state imaging device according to claim 1; and
a driving section for driving the solid-state imaging device, the driving section including a driving signal generating section that generates a driving signal for driving the signal output section and an encoding section that encodes the driving signal generated by the driving signal generating section,
wherein the semiconductor substrate includes a decoding section that decodes the driving signal supplied from the encoding section and supplies the decoded driving signal to the signal output section provided in the semiconductor substrate.

10. The imaging apparatus according to claim 9, wherein the driving signal generating section generates the driving signal the number of times required for driving the signal output section provided in one semiconductor substrate, and
the encoding section simultaneously supplies a driving signal, which is obtained by encoding the driving signal, to all of the decoding section included in the solid-state imaging device.

11. The imaging apparatus according to claim 9, wherein the substrate is a circuit board including the driving signal generating section and the encoding section, and
a wiring line for connection between the decoding section of the solid-state imaging device and the encoding section of the circuit board is provided to pass through the semiconductor substrate.

12. A method for manufacturing a solid-state imaging device including a substrate and a plurality of photoelectric conversion elements arranged in a one-dimensional or two-dimensional array above the substrate, the method comprising:
forming a signal output section in each of a plurality of semiconductor substrates, for outputting signals corresponding to electric charges generated in the photoelectric conversion elements;
forming a pad portion with a conductive material on each of the plurality of semiconductor substrates so that the pad portion is electrically connected to the signal output section;
arraying the plurality of semiconductor substrates on the substrate in a state where the pad portion is located upward; and
forming the photoelectric conversion elements each including a pixel electrode, a photoelectric conversion layer, and a opposite electrode, wherein the forming of the photoelectric conversion elements includes forming the pixel electrode on the pad portion of each of the plurality of semiconductor substrates, independently for every pad portion, forming the photoelectric conversion layer having a one-sheet configuration on the pixel electrode, and forming the opposite electrode having a one-sheet configuration on the photoelectric conversion layer;
wherein the plurality of semiconductor substrates are horizontally in contact and adjacent to each other wherein the opposite electrode has a one-sheet configuration common to the plurality of photoelectric conversion elements and the photoelectric conversion layer has a one-sheet configuration common to the plurality of photoelectric conversion elements.

13. A method for manufacturing a solid-state imaging device including a substrate and a plurality of photoelectric conversion elements arranged in a one-dimensional or two-dimensional array above the substrate, the method comprising:

forming a signal output section in each of a plurality of semiconductor substrates, for outputting signals corresponding to electric charges generated in the photoelectric conversion elements;

forming a pad portion with a conductive material on each of the plurality of semiconductor substrates so that the pad portion is electrically connected to the signal output section;

arraying the plurality of semiconductor substrates on the substrate in a state where the pad portion is located upward;

forming the plurality of photoelectric conversion elements each including a pixel electrode formed at a position corresponding to the pad portion of each of the plurality of semiconductor substrates, a photoelectric conversion layer that has a one-sheet configuration and is formed on the pixel electrode, and a opposite electrode that has a one-sheet configuration and is formed on the photoelectric conversion layer; and bonding the pad portion and the pixel electrode corresponding to the pad portion together;

wherein the plurality of semiconductor substrates are horizontally in contact and adjacent to each other wherein the opposite electrode has a one-sheet configuration common to the plurality of photoelectric conversion elements and the photoelectric conversion layer has a one-sheet configuration common to the plurality of photoelectric conversion elements.

* * * * *